US012684980B2

(12) United States Patent
Li et al.

(10) Patent No.: US 12,684,980 B2
(45) Date of Patent: Jul. 14, 2026

(54) DISPLAY SUBSTRATE, MANUFACTURING METHOD, DISPLAY APPARATUS AND MASK

(71) Applicant: BOE TECHNOLOGY GROUP CO., LTD., Beijing (CN)

(72) Inventors: Yansong Li, Beijing (CN); Shanshan Bai, Beijing (CN); Lujiang Huangfu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 911 days.

(21) Appl. No.: 17/760,358

(22) PCT Filed: Nov. 10, 2021

(86) PCT No.: PCT/CN2021/129769
§ 371 (c)(1),
(2) Date: Aug. 8, 2022

(87) PCT Pub. No.: WO2022/179184
PCT Pub. Date: Sep. 1, 2022

(65) Prior Publication Data
US 2023/0354668 A1 Nov. 2, 2023

(30) Foreign Application Priority Data
Feb. 24, 2021 (CN) .......................... 202110209752.9

(51) Int. Cl.
*H10K 59/35* (2023.01)
*H10K 59/12* (2023.01)
(52) U.S. Cl.
CPC ....... *H10K 59/352* (2023.02); *H10K 59/1201* (2023.02); *H10K 59/353* (2023.02)

(58) Field of Classification Search
CPC ....... H10K 59/121; H10K 59/351–353; H10K 59/1201
See application file for complete search history.

(56) References Cited

U.S. PATENT DOCUMENTS

2017/0077191 A1 3/2017 Hwang et al.
2021/0098539 A1* 4/2021 Zhang .................. H10K 59/131

FOREIGN PATENT DOCUMENTS

CN 107887404 A 4/2018
CN 108010934 * 5/2018 ........... H10K 59/352
(Continued)

OTHER PUBLICATIONS

English Translation of CN108010934 (taken from espacenet) (Year: 2018).*
(Continued)

*Primary Examiner* — Eric K Ashbahian
(74) *Attorney, Agent, or Firm* — WHDA, LLP

(57) ABSTRACT

The present disclosure provides a display substrate, a manufacturing method thereof, a display apparatus and a mask. In the display substrate, a pixel unit at least includes a first sub-pixel, a second sub-pixel and a third sub-pixel, a luminance brightness ratio of the first sub-pixel is greater than a luminance brightness ratio of the second sub-pixel, and the luminance brightness ratio of the second sub-pixel is greater than a luminance brightness ratio of the third sub-pixel. The first sub-pixel and the second sub-pixel are located in a first column, the third sub-pixel is located in a second column, and the plurality of pixel units includes a plurality of first pixel units and a plurality of second pixel units.

15 Claims, 5 Drawing Sheets

(56)　　　　　References Cited

FOREIGN PATENT DOCUMENTS

| | | | |
|---|---|---|---|
| CN | 108010934 | A | 5/2018 |
| CN | 110620135 | A | 12/2019 |
| CN | 110707141 | * | 1/2020 ............ H02L 27/32 |
| CN | 110767733 | A | 2/2020 |

OTHER PUBLICATIONS

English Translation of CN110707141 (taken from espacenet) (Year: 2020).*

ISA China National Intellectual Property Administration, International Search Report and Written Opinion Issued in Application No. PCT/CN2021/129769, Jan. 25, 2022, WIPO, 13 pages. (Submitted with Partial Translation).

* cited by examiner

DISPLAY SUBSTRATE, MANUFACTURING METHOD, DISPLAY APPARATUS AND MASK

CROSS-REFERENCE TO RELATED APPLICATION

The present application is a U.S. National Phase of International Application No. PCT/CN2021/129769, entitled "DISPLAY SUBSTRATE, MANUFACTURING METHOD, DISPLAY APPARATUS AND MASK", and filed on Nov. 10, 2021. International Application No. PCT/CN2021/129769_claims a priority to Chinese Patent Application No. 202110209752.9 filed on Feb. 24, 2021. The entire contents of the above-listed applications are hereby incorporated by reference for all purposes.

TECHNICAL FIELD

The present disclosure relates to the field of display technology, in particular to a display substrate, a manufacturing method thereof, a display apparatus and a mask.

BACKGROUND

For an Active Matrix Organic Light-Emitting Diode (AMOLED) display panel, red, green and blue sub-pixels need to be provided to realize color display based on the principle of spatial color mixing. Currently, as a development trend, a resolution of the display panel becomes higher and higher, and the image quality is highly demanded. However, the red, green and blue sub-pixels of the AMOLED display panel are formed through evaporation, and a Fine Metal Mask (FMM) with excellent mechanical stability is required. Due to the limitation of an FMM process capability, it is impossible to meet the requirement on the high resolution. Hence, dummy pixels are commonly used in the industry at present, and the red and blue sub-pixels are reused so as to reduce the quantity of red and blue sub-pixels, thereby to achieve the high resolution and meet the requirement on the FMM process.

Although the high resolution is achieved theoretically through the dummy pixels, a partial distortion and some visual defects, e.g., pixel grains, serrations and colored edges, inevitably occur for an image displayed by the display panel, and thereby a display effect of the display panel is adversely affected.

SUMMARY

An object of the present disclosure is to provide a display substrate, a manufacturing method thereof, a display apparatus and a mask, so as to solve the problems in the related art.

In order to achieve the above object, the present disclosure provides the following technical solutions.

In one aspect, the present disclosure provides in some embodiments a display substrate, including a base substrate and a plurality of pixel units arranged in an array form on the base substrate. Each pixel unit at least includes a first sub-pixel, a second sub-pixel and a third sub-pixel, a luminance brightness ratio of the first sub-pixel is greater than a luminance brightness ratio of the second sub-pixel, and the luminance brightness ratio of the second sub-pixel is greater than a luminance brightness ratio of the third sub-pixel. In a first direction, the first sub-pixel and the second sub-pixel are located in a first column, the third sub-pixel is located in a second column, and the first column and the second column are arranged in a second direction crossing the first direction. The plurality of pixel units includes a plurality of first pixel units and a plurality of second pixel units, and the first sub-pixel and the second sub-pixel in the first pixel unit are arranged in an order opposite to the first sub-pixel and the second sub-pixel in the second pixel unit in the first direction. The plurality of pixel units is arranged in rows and columns, the first pixel units and the second pixel units in each row are arranged alternately, a distance between the first sub-pixels is less than a distance between the second sub-pixels in the first pixel unit and the second pixel unit adjacent to each other, and the first sub-pixels and the second sub-pixels in the pixel units in each column are arranged in a same column in the first direction.

In a possible embodiment of the present disclosure, in the pixel units in each row, at least a part of first sub-pixels in the first pixel units are staggered from at least a part of second sub-pixels in the second pixel units in the first direction, and in the pixel units in each row, at least a part of second sub-pixels in the first pixel units are staggered from at least a part of first sub-pixels in the second pixel units in the first direction.

In a possible embodiment of the present disclosure, in the pixel units in each row, at least a part of third sub-pixels in the first pixel units are staggered from at least a part of third sub-pixels in the second pixel units in the first direction.

In a possible embodiment of the present disclosure, the third sub-pixels in the pixel units in each row have a same height in the first direction.

In a possible embodiment of the present disclosure, in the pixel units in each row, a height of the third sub-pixel in each first pixel unit is the same as a height of the first sub-pixel in each second pixel unit in the first direction.

In a possible embodiment of the present disclosure, in each of the first pixel units and the second pixel units, a pixel brightness center of a pixel including the first sub-pixel, the second sub-pixel and the third sub-pixel is located between the first sub-pixel and the second sub-pixel, and a distance L1 between the pixel brightness center and a center of gravity of the first sub-pixel in the pixel unit to which the first sub-pixel belongs satisfies $L1=(\frac{1}{3})L$, where L is a distance between the center of gravity of the first sub-pixel and a center of gravity of the second sub-pixel in the same pixel unit. In the pixel units in each row, the pixel brightness center of the first pixel unit and the pixel brightness center of the second pixel unit are located in the same row in the second direction, and the pixel brightness centers in the pixel units are arranged evenly in an array form in the first direction and the second direction.

In a possible embodiment of the present disclosure, the pixel units in each column includes a plurality of first pixel units or a plurality of second pixel units.

In a possible embodiment of the present disclosure, the first sub-pixels and the second sub-pixels are arranged alternately and spaced apart from each other at a same interval in the pixel units in each column.

In a possible embodiment of the present disclosure, the first pixel units and the second pixel units are arranged alternately in the first direction in the pixel units in each column.

In a possible embodiment of the present disclosure, the first sub-pixel, the second sub-pixel and the third sub-pixel are each of a rectangular shape, and a long side of the third sub-pixel extends in the first direction.

In a possible embodiment of the present disclosure, the first sub-pixel includes a green sub-pixel, the second sub-pixel includes a red sub-pixel and the third sub-pixel includes a blue sub-pixel.

In a possible embodiment of the present disclosure, in each pixel unit, a distance between a center of gravity of the first sub-pixel and a center of gravity of the second sub-pixel, a distance between the center of gravity of the first sub-pixel and a center of gravity of the third sub-pixel, and a distance between the center of gravity of the second sub-pixel and the center of gravity of the third sub-pixel are the same.

In another aspect, the present disclosure provides in some embodiments a display apparatus including the above-mentioned display substrate.

In yet another aspect, the present disclosure provides in some embodiments a mask, including a mask body and a plurality of pixel apertures formed in the mask body. The plurality of pixel apertures includes pixel apertures arranged in columns in a second direction, the pixel apertures in each column include a plurality of pixel apertures arranged in a first direction crossing the second direction, and a portion of the mask body between two adjacent columns of pixel apertures extends in the first direction.

In a possible embodiment of the present disclosure, the pixel apertures in odd-numbered columns are at least partially staggered from the pixel apertures in even-numbered columns in the first direction.

In a possible embodiment of the present disclosure, the plurality of pixel apertures includes a plurality of pixel apertures arranged in rows in the first direction, the pixel apertures in each row include a plurality of pixel apertures arranged in the second direction, and the pixel apertures in each row have a same height in the first direction.

In still yet another aspect, the present disclosure provides in some embodiments a method for manufacturing a display substrate. The display substrate includes a base substrate and a plurality of pixel units arranged in an array form on the base substrate, the plurality of pixel units is arranged in rows and columns, and each pixel unit at least includes a first sub-pixel, a second sub-pixel and a third sub-pixel. The method includes forming at least one of the first sub-pixel, the second sub-pixel and the third sub-pixel through the above-mentioned mask. The first sub-pixel and the second sub-pixel are located in a first column, the third sub-pixel is located in a second column, a luminance brightness ratio of the first sub-pixel is greater than a luminance brightness ratio of the second sub-pixel, and the luminance brightness ratio of the second sub-pixel is greater than a luminance brightness ratio of the third sub-pixel. The plurality of pixel units includes a plurality of first pixel units and a plurality of second pixel units. In the first pixel unit, the first sub-pixel is close to a first end of the third sub-pixel, and the second sub-pixel is close to a second end of the third sub-pixel. In the second pixel unit, the first sub-pixel is close to a second end of the third sub-pixel, and the second sub-pixel is close to a first end of the third sub-pixel. The first pixel units and the second pixel units are arranged alternately in the pixel units in each row, and in the first pixel unit and the second pixel unit adjacent to each other, a distance between the first sub-pixels is less than a distance between the second sub-pixels. The first sub-pixels and the second sub-pixels in the pixel units in each column are located in a same column.

According to the embodiments of the present disclosure, the luminance brightness ratio of the first sub-pixel is greater than the luminance brightness ratio of the second sub-pixel, the luminance brightness ratio of the second sub-pixel is greater than the luminance brightness ratio of the third sub-pixel, the first sub-pixel and the second sub-pixel are located in the first column, and the third sub-pixel is located in the second column, so that the brightness center is located between the first sub-pixel and the second sub-pixel in each pixel unit. In addition, the luminance brightness ratio of the first sub-pixel is the greatest, so the brightness center in each pixel unit is closer to the first sub-pixel.

BRIEF DESCRIPTION OF THE DRAWINGS

The following drawings are provided to facilitate the understanding of the present disclosure, and constitute a portion of the description. These drawings and the following embodiments are for illustrative purposes only, but shall not be construed as limiting the present disclosure. In these drawings.

DETAILED DESCRIPTION

The present disclosure will be described hereinafter in conjunction with the drawings and embodiments.

In order to meet the requirement on high image quality, a resolution of a display apparatus increases gradually. At present, dummy pixels are widely used in the industry to reduce the quantity of sub-pixels through reusing some sub-pixels, so as to reduce a process difficulty in an FMM for evaporation.

Figure 1:
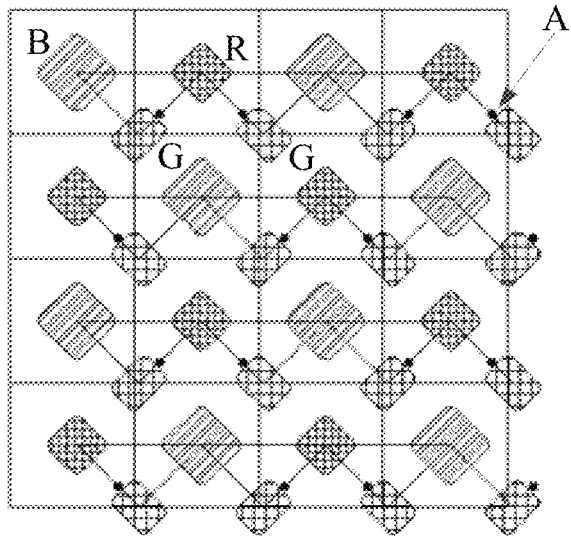
FIG. 1 is a schematic view showing the arrangement of diamond-shaped RGBG dummy pixels.

FIG. 1 shows the arrangement of a diamond-shaped RGBG dummy pixel, where adjacent dummy pixels on the left and the right share an R sub-pixel and a B sub-pixel, so that the quantity of R sub-pixels and B sub-pixels is halved, and the quantity of G sub-pixels remains unchanged.

For the display apparatus, a color image is formed on the basis of three primary colors, i.e., red, green and blue, which are consistent with colors sensed by red cone cells, green cone cells and blue cone cells on a retina of human-being. As a basic imaging process of human eyes, a photosensitive cell is simulated with light to generate an electric pulse for stimulating a nerve center, thereby to form an image of a scene in the brain. The human eye has different capabilities for brightness and colors. For example, the human eye has a greatest capability for green, and a smallest capability for blue. Contribution of the green sub-pixel to the brightness occupies about 65% of the total brightness, contribution of the red sub-pixel to the brightness occupies about 30% of the total brightness, and contribution of the blue sub-pixel to the brightness merely occupies about 5% of the total brightness. Hence, a pixel brightness center A of a pixel including the RGB sub-pixels is approximately located on a line connecting a center of gravity of the G sub-pixel and the R sub-pixel at a position close to the G sub-pixel at a distance of ⅓ of a length of the line.

Figure 2:
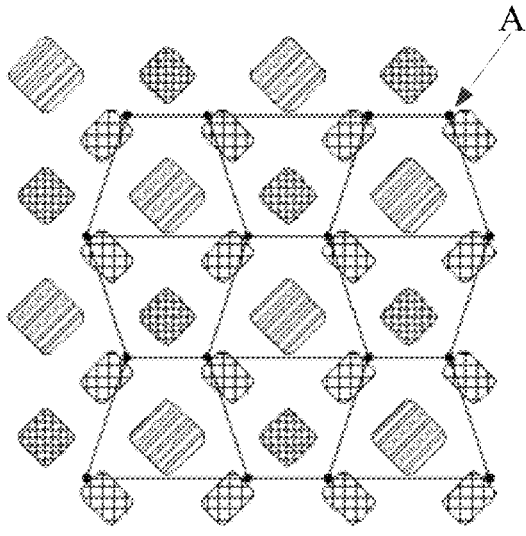
FIG. 2 is a schematic view showing lines connecting centers of the diamond-shaped RGBG dummy pixels.

FIG. 2 shows the lines connecting the brightness centers A of the diamond-shaped RGBG dummy pixels. As shown in FIG. 2, brightness centers A of adjacent white points adjacent to each other in a horizontal direction (i.e., white points each including the RGB sub-pixels) are spaced apart from each other at different distances, and the brightness centers A are distributed in a serrated or wave-like manner rather than on a straight line in a longitudinal direction. Hence, the brightness centers A of the white points are distributed unevenly as a whole, and thereby grains and serrations occur for an image.

Figure 3:
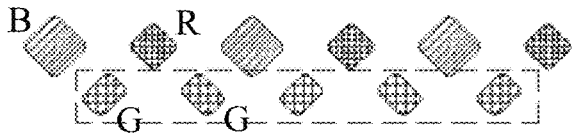
FIG. 3 is a schematic view showing pixel units in one row in FIG. 2.

In addition, FIG. 3 shows a situation where a single horizontal line is displayed through the RGBG sub-pixels. As shown in FIG. 3, the R sub-pixels and the B sub-pixels are arranged at an upper edge, and the G sub-pixels are arranged at a lower edge. The sensitivities of the human eye to the brightness of the RGB sub-pixels are greatly different, so such a colored edge phenomenon with a purplish-red upper edge and a greenish lower edge occurs visually.

As shown in FIGS. 4, 5, 7 and 8, the present disclosure provides in some embodiments a display substrate, which includes a base substrate and a plurality of pixel units arranged in an array form on the base substrate. Each pixel unit at least includes a first sub-pixel 1, a second sub-pixel 2 and a third sub-pixel 3, a luminance brightness ratio of the first sub-pixel 1 is greater than a luminance brightness ratio of the second sub-pixel 2, and the luminance brightness ratio of the second sub-pixel 2 is greater than a luminance brightness ratio of the third sub-pixel 3. In a first direction, the first sub-pixel 1 and the second sub-pixel 2 are located in a first column, the third sub-pixel 3 is located in a second column, and the first column and the second column are arranged in a second direction crossing the first direction. The plurality of pixel units includes a plurality of first pixel units and a plurality of second pixel units, and the first sub-pixel 1 and the second sub-pixel 2 in the first pixel unit are arranged in an order opposite to the first sub-pixel and the second sub-pixel in the second pixel unit in the first direction. The plurality of pixel units is arranged in rows and columns, the first pixel units and the second pixel units in each row are arranged alternately, a distance between the first sub-pixels 1 is less than a distance between the second sub-pixels 2 in the first pixel unit and the second pixel unit adjacent to each other, and the first sub-pixels 1 and the second sub-pixels 2 in the pixel units in each column are arranged in a same column in the first direction.

Illustratively, the display substrate further includes a plurality of sub-pixel driving circuitries distributed in an array form and arranged between the plurality of pixel units and the base substrate. Each sub-pixel corresponds to one sub-pixel driving circuitry, and it emits light under the effect of a driving signal provided by the corresponding sub-pixel driving circuitry.

Illustratively, the first sub-pixel 1, the second sub-pixel 2 and the third sub-pixel 3 each include a pixel aperture region and a corresponding organic light-emitting material layer, and at least a part of the organic light-emitting material layer is located in the pixel aperture region.

Illustratively, the luminance brightness ratio of the sub-pixel refers to the contribution of the sub-pixel to the brightness. Illustratively, the first sub-pixel 1 contributes 65% to the brightness, the second sub-pixel 2 contributes 30% to the brightness, and the third sub-pixel 3 contributes 5% to the brightness.

Illustratively, the first direction includes a longitudinal direction and the second direction includes a horizontal direction. Illustratively, in each pixel unit, in the first direction, the first sub-pixel 1 and the second sub-pixel 2 are located in the first column, the third sub-pixel 3 is located in the second column, the first column and the second column are arranged in the second direction, and lines connecting a center of gravity of the first sub-pixel 1, a center of gravity of the second sub-pixel 2 and a center of gravity of the third sub-pixel 3 form a triangle.

Illustratively, the first sub-pixel 1 is arranged at a lower side of the first pixel unit and the second sub-pixel 2 is arranged at an upper side of the first pixel unit. The first sub-pixel 1 is arranged at an upper side of the second pixel unit, and the second sub-pixel 2 is arranged at a lower side of the second pixel unit.

Illustratively, the plurality of pixel units is arranged rows and columns. The rows of pixel units are arranged in the first direction, and the first pixel units and the second pixel units are arranged alternately in the second direction in each row. The columns of pixel units are arranged in the second direction, and the pixel units in each column include a plurality of pixel units arranged in the first direction.

Illustratively, in the pixel units in each row, the distance between the first sub-pixels 1 is less than the distance between the second sub-pixels 2 in the first pixel unit and the second pixel unit adjacent to each other.

Illustratively, in the pixel units in each column, the first sub-pixels 1 and the second sub-pixels 2 are located in a same column in the first direction, and the third sub-pixels 3 are located in a same column in the first direction.

Figure 4:
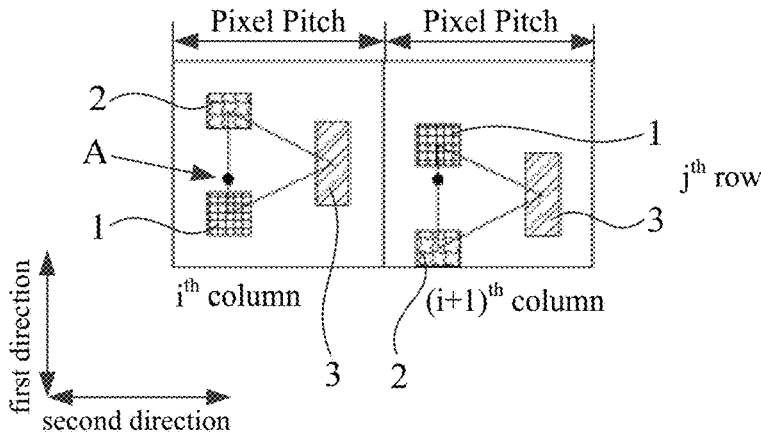
FIG. 4 is a schematic view showing a structure of a first pixel unit and a second pixel unit adjacent to each other according to one embodiment of the present disclosure.

Illustratively, as shown in FIG. 4, a real RGB pixel arrangement structure is presented, where a minimum repeating unit includes two pixel pitches, one pixel pitch includes the first pixel unit, and the other pixel pitch includes the second pixel unit. Each of the first pixel unit and the second pixel unit includes the first sub-pixel 1, the second sub-pixel 2 and the third sub-pixel 3. In other words, the minimum repeating unit totally includes six sub-pixels. Illustratively, the centers of gravity of the first sub-pixels 1 and the second sub-pixels 2 are arranged in a same column and close to each other in the first direction, and the centers of gravity of the third sub-pixels 3 are arranged in another column. Through the pixel arrangement structure, it is able to display an image at real 400 PPI or more, which exceeds the capability of the retina of the human eye.

Illustratively, in the pixel units in any two adjacent columns, the first sub-pixel 1 and the second sub-pixel 2 in the first pixel unit in one column are arranged in an order opposite to the first sub-pixel 1 and the second sub-pixel 2 in the second pixel unit in another column in the first direction.

Based on the above-mentioned structure of the display substrate, the luminance brightness ratio of the first sub-pixel 1 is greater than the luminance brightness ratio of the second sub-pixel 2, the luminance brightness ratio of the second sub-pixel 2 is greater than the luminance brightness ratio of the third sub-pixel 3, the first sub-pixel 1 and the second sub-pixel 2 are located in the first column, and the third sub-pixel 3 is located in the second column, so that the brightness center is located between the first sub-pixel 1 and the second sub-pixel 2 in each pixel unit. In addition, the luminance brightness ratio of the first sub-pixel 1 is the greatest, so the brightness center in each pixel unit is closer to the first sub-pixel 1.

In addition, the first sub-pixel 1 and the second sub-pixel 2 in the first pixel unit are arranged in an order opposite to the first sub-pixel 1 and the second sub-pixel 2 in the second pixel unit in the first direction, and the distance between the first sub-pixels 1 is less than the distance between the second sub-pixels 2 in the first pixel unit and the second pixel unit adjacent to each other, so the brightness centers of the pixel units in a same row are arranged on a same horizontal line extending in the second direction.

Moreover, the first sub-pixel 1 and the second sub-pixel 2 in each pixel unit in each column are arranged in a same column in the first direction, so the brightness centers of the pixel units in a same column are arranged on a same vertical line extending in the first direction.

Hence, in the display substrate in the embodiments of the present disclosure, depending on the difference of a human eye visual system in the sensitivities to the colors, the brightness centers of the white points formed by the pixel units are arranged evenly at an equal distance on a line in each of the horizontal direction, the longitudinal direction and a 45° direction. As a result, it is able to achieve an even display effect without any grains or serrations, thereby to solve the problem in the related art where the display effect is adversely affected due to the sharing of the dummy pixels.

In addition, the luminance brightness ratio of each of the first sub-pixel 1 and the second sub-pixel 2 is relatively high, so the first sub-pixel 1 and the second sub-pixel 2 are arranged in the same column, so as to not only prevent the occurrence of the colored edge when the first sub-pixels 1 and the second sub-pixels 2 are arranged in different columns, but also prevent the occurrence of the colored edge when the first sub-pixel 1 is combined with the third sub-pixel 3 or the second sub-pixel 2 is combined with the third sub-pixel 3. The luminance brightness ratio of the third sub-pixel 3 is low, and when the third sub-pixels 3 are arranged in another column, the brightness is even ignored by the human eye and no colored edge occurs, so it is able to improve an overall display effect of the display substrate.

Figure 10:
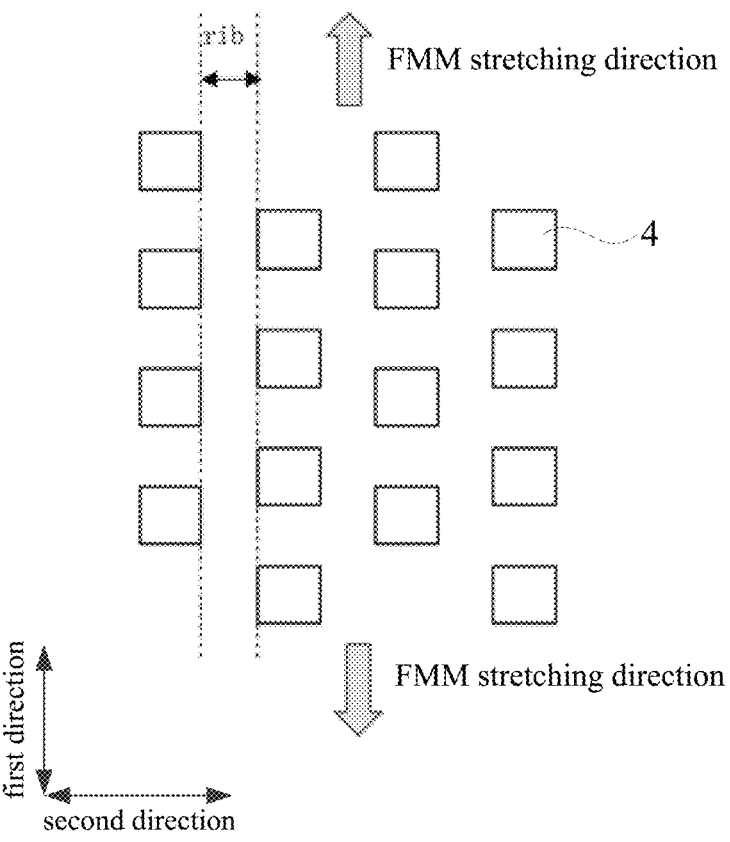
FIG. 10 is a schematic view showing the layout of a mask according to one embodiment of the present disclosure.
Figure 11:
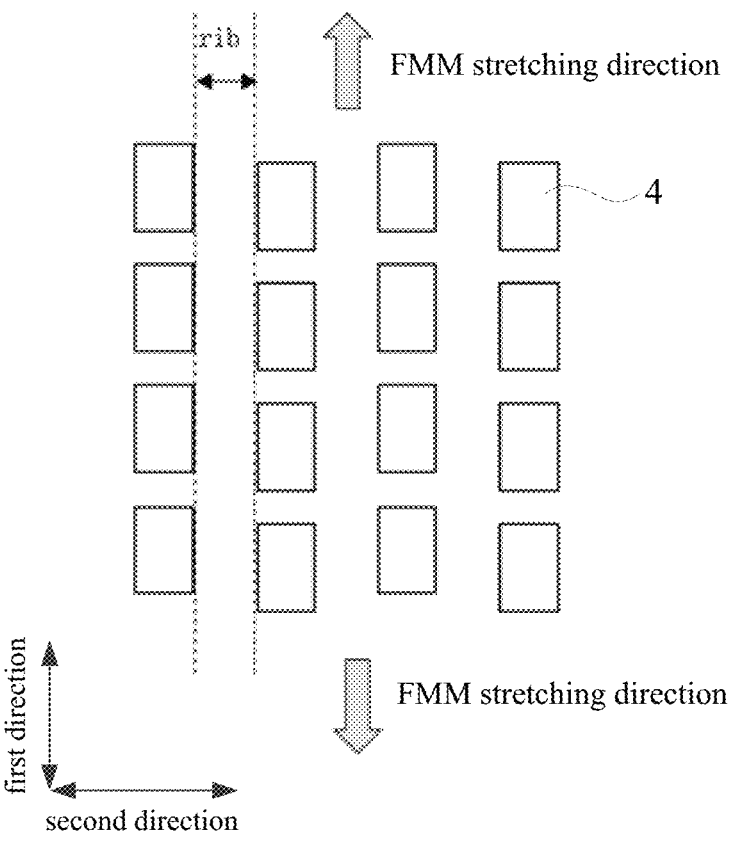
FIG. 11 is another schematic view showing the layout of the mask according to one embodiment of the present disclosure.
Figure 12:
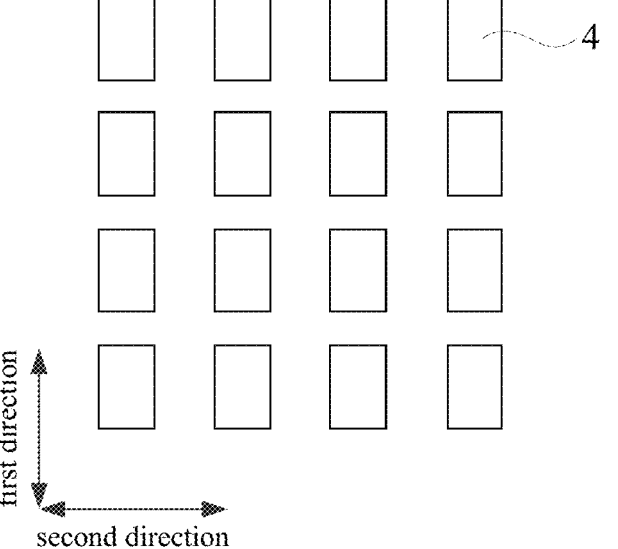
FIG. 12 is yet another schematic view showing the layout of the mask according to one embodiment of the present disclosure.

In addition, as shown in FIGS. 10 to 12, in the display substrate according to the embodiments of the present disclosure, in the first direction, the first sub-pixel 1 and the second sub-pixel 2 are arranged in the first column, and the third sub-pixel 3 is arranged in the second column. The first sub-pixels 1 and the second sub-pixels 2 in the pixel units in each column are arranged in a same column in the first direction, and the third sub-pixels 3 in the pixel units in each column are arranged in a same column in the first direction. At this time, the pixel apertures 4 in the mask for forming the sub-pixels are arranged evenly in an array form in each direction, and a portion of a mask body of the mask between the two adjacent columns of pixel apertures 4 extends in the first direction. As a result, it is able to provide the mask with stronger mechanical stability, thereby to reduce the difficulty in the manufacture of the FMM as well as the difficulty in a stretching process.

Figure 5:
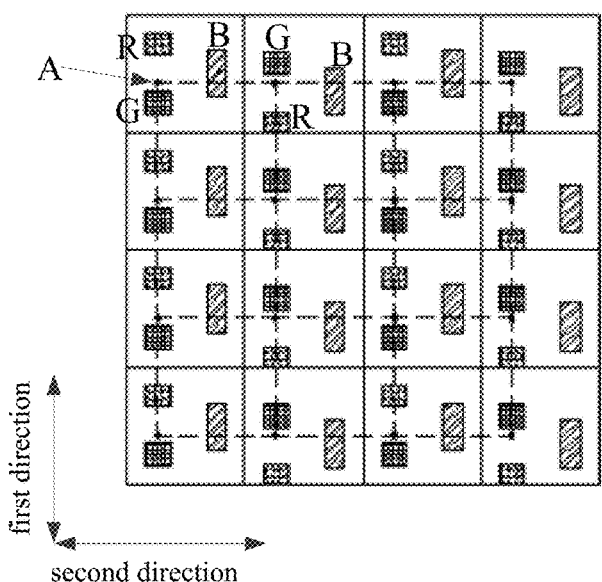
FIG. 5 is a schematic view showing the layout of the pixel units according to one embodiment of the present disclosure.
Figure 6:
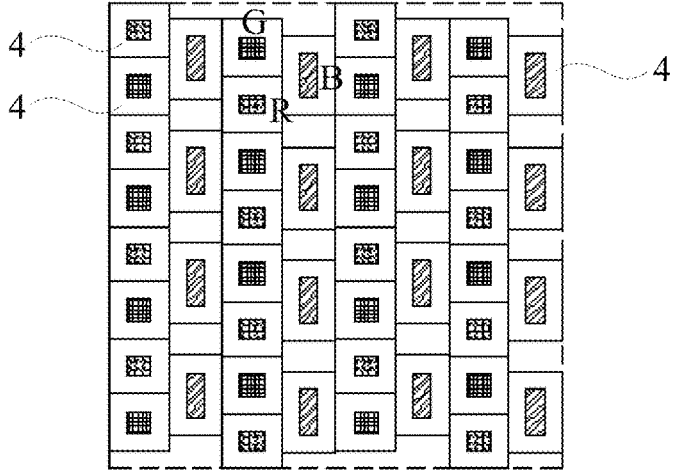
FIG. 6 is a schematic view showing the layout of the pixel units and corresponding pixel apertures according to one embodiment of the present disclosure.
Figure 8:
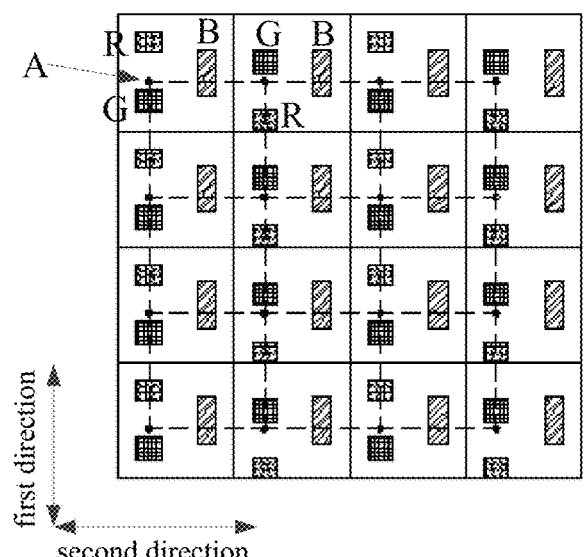
FIG. 8 is another schematic view showing the layout of the pixel units according to one embodiment of the present disclosure.
Figure 9:
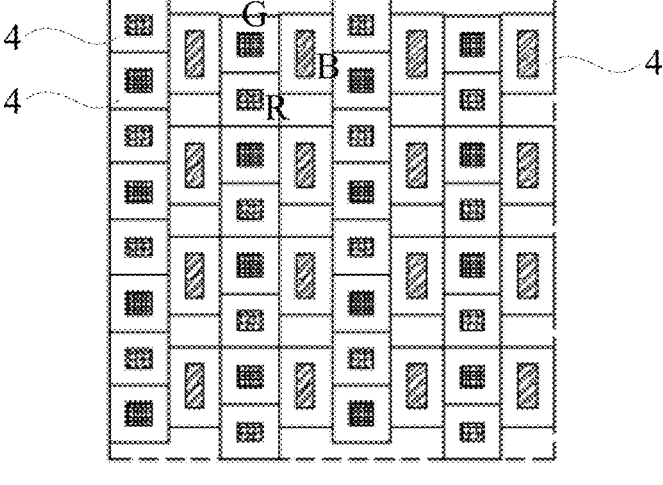
FIG. 9 is another schematic view showing the layout of the pixel units and the corresponding pixel apertures according to one embodiment of the present disclosure.

As shown in FIGS. 5 and 8, in some embodiments of the present disclosure, in the pixel units in each row, at least a part of first sub-pixels 1 in the first pixel units are staggered from at least a part of second sub-pixels 2 in the second pixel units in the first direction, and in the pixel units in each row, at least a part of second sub-pixels 2 in the first pixel units are staggered from at least a part of first sub-pixels 1 in the second pixel units in the first direction.

Illustratively, relative positions of the first sub-pixel 1, the second sub-pixel 2 and the third sub-pixel 3 in each pixel unit are constant, but at least a part of the sub-pixels in the pixel units in any two adjacent columns have different heights in the longitudinal direction.

Illustratively, in the first pixel unit, the longitudinal height of the second sub-pixel 2 is greater than the longitudinal height of the first pixel, and in the second pixel unit, the longitudinal height of the first sub-pixel 1 is greater than the longitudinal height of the second sub-pixel 2. Illustratively, in the pixel units in a same row, the longitudinal height of the second sub-pixel 2 in the first pixel unit is greater than the longitudinal height of the first sub-pixel 1 in the second pixel unit. Illustratively, in the pixel units in a same row, the longitudinal height of the first sub-pixel 1 in the first pixel unit is greater than the longitudinal height of the second sub-pixel 2 in the second pixel unit. Illustratively, in the pixel units in a same row, the longitudinal height of the first sub-pixel 1 in the first pixel unit is smaller than the longitudinal height of the first sub-pixel 1 in the second pixel unit.

Based on the above, the brightness centers of the pixel units in a same row are arranged on a same horizontal line extending in the second direction, so it is able to achieve an even display effect without any grains or serrations.

As shown in FIG. 4, in some embodiments of the present disclosure, in the pixel units in each row, at least a part of third sub-pixels 3 in the first pixel units are staggered from at least a part of third sub-pixels 3 in the second pixel units in the first direction.

Illustratively, in the pixel units in each row, a longitudinal height of the third sub-pixel 3 in the first pixel unit is greater than a longitudinal height of the third sub-pixel 3 in the second pixel unit.

Illustratively, in the pixel units in each row, the longitudinal height of the third sub-pixel 3 in the first pixel unit is smaller than the longitudinal height of the third sub-pixel 3 in the second pixel unit.

Illustratively, in the first pixel unit and/or the second pixel unit, the longitudinal height of the third sub-pixel 3 is greater than the longitudinal height of the first sub-pixel 1 and smaller than the longitudinal height of the second sub-pixel 2.

Illustratively, in the first pixel unit and/or the second pixel unit, the longitudinal height of the third sub-pixel 3 is smaller than the longitudinal height of the first sub-pixel 1 and greater than the longitudinal height of the second sub-pixel 2.

Illustratively, in the first pixel unit and/or the second pixel unit, the longitudinal height of the third sub-pixel 3 is equal to the longitudinal height of the first sub-pixel 1.

Illustratively, in the first pixel unit and/or the second pixel unit, the longitudinal height of the third sub-pixel 3 is equal to the longitudinal height of the second sub-pixel 2.

Figure 7:
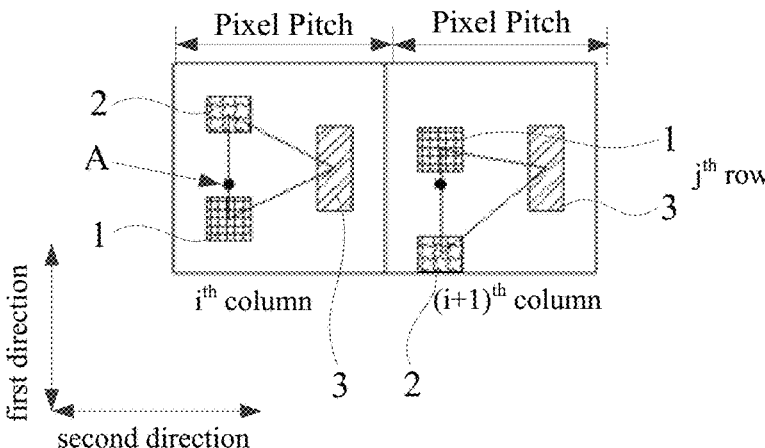
FIG. 7 is another schematic view showing the structure of the first pixel unit and the second pixel unit adjacent to each other according to one embodiment of the present disclosure.

As shown in FIG. 7, in some embodiments of the present disclosure, the third sub-pixels 3 in the pixel units in each row has a same height in the first direction.

The luminance brightness ratio of the third sub-pixel 3 is very small, and the human eye is not sensitive thereto, so the influence caused by the adjustment of the position of the third sub-pixel 3 on the brightness center of the white point may be substantially omitted. When the third sub-pixels 3 in the pixel units are arranged evenly in an array form in the horizontal and longitudinal directions, it is also able to ensure the even arrangement of the brightness centers of the white points.

In some embodiments of the present disclosure, in the pixel units in each row, a height of the third sub-pixel 3 in each first pixel unit is the same as a height of the first sub-pixel 1 in each second pixel unit in the first direction.

Based on the above, it is able to provide the brightness centers evenly.

As shown in FIGS. 4 and 7, in some embodiments of the present disclosure, in each of the first pixel units and the second pixel units, a pixel brightness center of a pixel including the first sub-pixel 1, the second sub-pixel 2 and the third sub-pixel 3 is located between the first sub-pixel 1 and the second sub-pixel 2, and a distance L1 between the pixel brightness center and a center of gravity of the first sub-pixel 1 in the pixel unit to which the first sub-pixel 1 belongs satisfies L1=($\frac{1}{3}$) L, where L is a distance between the center of gravity of the first sub-pixel and a center of gravity of the second sub-pixel in the same pixel unit. In the pixel units in each row, the pixel brightness center of the first pixel unit and the pixel brightness center of the second pixel unit are located in the same row in the second direction, and the pixel brightness centers in the pixel units are arranged evenly in an array form in the first direction and the second direction.

Taking the pixel units in a $j^{th}$ row and an $i^{th}$ column as well as an $(i+1)^{th}$ column as an example, a brightness center of the pixel unit in the $j^{th}$ row and the $i^{th}$ column is located on a line connecting the center of gravity of the first sub-pixel 1 and the center of gravity of the second sub-pixel 2 at a position close to the first sub-pixel by a distance of $\frac{1}{3}$ of a total length of the line, and a brightness center of the pixel unit in the $j^{th}$ row and the $(i+1)^{th}$ column is located on a line connecting the center of gravity of the first sub-pixel 1 and the center of gravity of the second sub-pixel 2 at a position close to the first sub-pixel by a distance of $\frac{1}{3}$ of a total length of the line. The brightness centers of the pixel units in the $i^{th}$ column and the $(i+1)^{th}$ column are arranged along the second direction.

Based on the above, it is able to facilitate the even distribution of the brightness centers.

In some embodiments of the present disclosure, the pixel units in each column includes a plurality of first pixel units or a plurality of second pixel units.

Based on the above, it is able to facilitate the even distribution of the sub-pixels in the pixel units, thereby to improve the display effect of the display substrate in a better manner.

As shown in FIGS. 5 and 8, in some embodiments of the present disclosure, the first sub-pixels 1 and the second sub-pixels 2 are arranged alternately and spaced apart from each other at a same interval in the pixel units in each column.

Based on the above, it is able to facilitate the even distribution of the sub-pixels in the pixel units, thereby to improve the display effect of the display substrate in a better manner.

In some embodiments of the present disclosure, the first pixel units and the second pixel units are arranged alternately in the first direction in the pixel units in each column.

Based on the above, it is able to achieve the even display of the display substrate, thereby to improve the display effect of the display substrate in a better manner.

As shown in FIGS. 5 and 8, in some embodiments of the present disclosure, the first sub-pixel 1, the second sub-pixel 2 and the third sub-pixel 3 are each of a rectangular shape, and a long side of the third sub-pixel 3 extends in the first direction.

Based on the above, it is able to not only improve the mechanical stability of the FMM but also facilitate the adjustment of an aperture ratio of each sub-pixel.

It should be appreciated that, a red light-emitting material has a long service life, and a blue light-emitting material has a short service life, so it is able to provide a display panel with a same attenuation level through reducing an aperture ratio of the red sub-pixel and increasing an aperture ratio of the blue sub-pixel.

As shown in FIGS. 4, 5, 7 and 8, in some embodiments of the present disclosure, the first sub-pixel 1 includes a green sub-pixel, the second sub-pixel 2 includes a red sub-pixel the second sub-pixel 2 includes a red sub-pixel, and the third sub-pixel 3 includes a blue sub-pixel.

Illustratively, when the first sub-pixel 1 includes a green sub-pixel G, the second sub-pixel 2 includes a red sub-pixel R and the third sub-pixel 3 includes a blue sub-pixel B, i.e., the R sub-pixel and the G sub-pixel having a higher luminance brightness ratio are arranged in a same column, so it is able to prevent the occurrence of the colored edge when the R sub-pixel and the G sub-pixel are each arranged in a separate column, or the R sub-pixel or the G sub-pixel is combined with the B sub-pixel. In addition, the B sub-pixels have low brightness and are arranged in a separate column, and they are even ignored by the human eye, so no colored edge may occur.

As shown in FIG. 4, in some embodiments of the present disclosure, in each pixel unit, a distance between a center of gravity of the first sub-pixel 1 and a center of gravity of the second sub-pixel 2, a distance between the center of gravity of the first sub-pixel 1 and a center of gravity of the third sub-pixel 3, and a distance between the center of gravity of the second sub-pixel 2 and the center of gravity of the third sub-pixel 3 are the same.

Based on the above, it is able to achieve the even display of the display substrate, thereby to improve the display effect of the display substrate in a better manner.

The present disclosure further provides in some embodiments a display apparatus including the above-mentioned display substrate.

It should be appreciated that, the display apparatus may be any product or member having a display function, such as television, display, digital photo frame, mobile phone or tablet computer.

Based on the above-mentioned display substrate, the luminance brightness ratio of the first sub-pixel 1 is greater than the luminance brightness ratio of the second sub-pixel 2, the luminance brightness ratio of the second sub-pixel 2 is greater than the luminance brightness ratio of the third sub-pixel 3, the first sub-pixel 1 and the second sub-pixel 2 are located in the first column, and the third sub-pixel 3 is located in the second column, so that the brightness center is located between the first sub-pixel 1 and the second sub-pixel 2 in each pixel unit. In addition, the luminance brightness ratio of the first sub-pixel 1 is the greatest, so the brightness center in each pixel unit is closer to the first sub-pixel 1.

In addition, the first sub-pixel 1 and the second sub-pixel 2 in the first pixel unit are arranged in an order opposite to the first sub-pixel 1 and the second sub-pixel 2 in the second pixel unit in the first direction, and the distance between the first sub-pixels 1 is less than the distance between the second sub-pixels 2 in the first pixel unit and the second pixel unit adjacent to each other, so the brightness centers of the pixel units in a same row are arranged on a same horizontal line extending in the second direction.

Moreover, the first sub-pixel 1 and the second sub-pixel 2 in each pixel unit in each column are arranged in a same column in the first direction, so the brightness centers of the pixel units in a same column are arranged on a same vertical line extending in the first direction.

Hence, in the display substrate in the embodiments of the present disclosure, depending on the difference of a human eye visual system in the sensitivities to the colors, the brightness centers of the white points formed by the pixel units are arranged evenly at an equal distance on a line in each of the horizontal direction, the longitudinal direction and a 45° direction. As a result, it is able to achieve an even display effect without any grains or serrations, thereby to solve the problem in the related art where the display effect is adversely affected due to the sharing of the dummy pixels.

In addition, the luminance brightness ratio of each of the first sub-pixel 1 and the second sub-pixel 2 is relatively high, so the first sub-pixel 1 and the second sub-pixel 2 are arranged in the same column, so as to not only prevent the occurrence of the colored edge when the first sub-pixels 1 and the second sub-pixels 2 are arranged in different columns, but also prevent the occurrence of the colored edge when the first sub-pixel 1 is combined with the third sub-pixel 3 or the second sub-pixel 2 is combined with the third sub-pixel 3. The luminance brightness ratio of the third sub-pixel 3 is low, and when the third sub-pixels 3 are arranged in another column, the brightness is even ignored by the human eye and no colored edge occurs, so it is able to improve an overall display effect of the display substrate.

In addition, in the display substrate according to the embodiments of the present disclosure, in the first direction, the first sub-pixel 1 and the second sub-pixel 2 are arranged in the first column, and the third sub-pixel 3 is arranged in the second column. The first sub-pixels 1 and the second sub-pixels 2 in the pixel units in each column are arranged in a same column in the first direction, and the third sub-pixels 3 in the pixel units in each column are arranged in a same column in the first direction. At this time, the pixel apertures 4 in the mask for forming the sub-pixels are arranged evenly in an array form in each direction, and a portion of a mask body of the mask between the two adjacent columns of pixel apertures 4 extends in the first direction. As a result, it is able to provide the mask with stronger mechanical stability, thereby to reduce the difficulty in the manufacture of the FMM as well as the difficulty in a stretching process.

When the display apparatus includes the above-mentioned display substrate, it also has the above-mentioned beneficial effects, which will not be particularly defined herein.

As shown in FIGS. 6, 9 and 10 to 12, the present disclosure further provides in some embodiments a mask which includes a mask body and a plurality of pixel apertures 4 formed in the mask body. The plurality of pixel apertures 4 includes pixel apertures 4 arranged in columns in a second direction, the pixel apertures 4 in each column include a plurality of pixel apertures 4 arranged in a first direction crossing the second direction, and a portion of the mask body between two adjacent columns of pixel apertures 4 extends in the first direction.

Illustratively, the mask body is of grid-like shape, a portion of the mask body between two adjacent columns of pixel apertures 4 extends in the first direction, and at least a portion of the mask body between two adjacent rows of pixel apertures 4 extends in the second direction. Illustratively, the portion of the mask body between two adjacent columns of pixel apertures 4 has a same width in the second direction. Illustratively, the portion of the mask body between two adjacent columns of pixel apertures 4 has a same length in the first direction.

Illustratively, the pixel aperture 4 is of a rectangular shape. Illustratively, the plurality of pixel apertures 4 is distributed in an array form.

It should be appreciated that, the portion of the mask body between the two adjacent columns of pixel apertures 4 (i.e., an FMM rib) is a metallic raw material region between the pixel apertures 4 of the mask, and in the stretching process of the FMM, the rib in a stretching direction is a portion to which a force is applied to through which a force is transferred, so the stretching process of the FMM is greatly affected by the rib.

According to the mask in the embodiments of the present disclosure, the plurality of pixel apertures 4 is arranged evenly in an array form in each direction, and the portion of the mask body between the two adjacent columns of pixel apertures 4 extends in the first direction (i.e., the stretching direction), so it is able to provide the mask with stronger mechanical stability, thereby to reduce the difficulty in the manufacture of the FMM as well as the difficulty in the stretching process.

As shown in FIGS. 6, 9, 10, and 11, in some embodiments of the present disclosure, the pixel apertures 4 in odd-numbered columns are at least partially staggered from the pixel apertures 4 in even-numbered columns in the first direction.

Based on the above, it is able to form the first sub-pixel 1, the second sub-pixel 2 and the third sub-pixel 3 in the display substrate through the mask.

As shown in FIG. 12, in some embodiments of the present disclosure, the plurality of pixel apertures 4 includes a plurality of pixel apertures 4 arranged in rows in the first direction, the pixel apertures 4 in each row include a plurality of pixel apertures 4 arranged in the second direction, and the pixel apertures 4 in each row have a same height in the first direction.

Based on the above, it is able to form the third sub-pixel 3 in the display substrate through the mask.

The present disclosure further provides in some embodiments a method for manufacturing a display substrate. The display substrate includes a base substrate and a plurality of pixel units arranged in an array form on the base substrate, the plurality of pixel units is arranged in rows and columns, and each pixel unit at least includes a first sub-pixel 1, a second sub-pixel 2 and a third sub-pixel 3. The method includes forming at least one of the first sub-pixel 1, the second sub-pixel 2 and the third sub-pixel 3 through the above-mentioned mask. The first sub-pixel 1 and the second sub-pixel 2 are located in a first column, the third sub-pixel 3 is located in a second column, a luminance brightness ratio of the first sub-pixel 1 is greater than a luminance brightness ratio of the second sub-pixel 2, and the luminance brightness ratio of the second sub-pixel 2 is greater than a luminance brightness ratio of the third sub-pixel 3. The plurality of pixel units includes a plurality of first pixel units and a plurality of second pixel units. In the first pixel unit, the first sub-pixel 1 is close to a first end of the third sub-pixel 3, and the second sub-pixel 2 is close to a second end of the third sub-pixel 3. In the second pixel unit, the first sub-pixel 1 is close to a second end of the third sub-pixel 3, and the second sub-pixel 2 is close to a first end of the third sub-pixel 3. The first pixel units and the second pixel units are arranged alternately in the pixel units in each row, and in the first pixel unit and the second pixel unit adjacent to each other, a distance between the first sub-pixels 1 is less than a distance between the second sub-pixels 2. The first sub-pixels 1 and the second sub-pixels 2 in the pixel units in each column are located in a same column.

Illustratively, the first sub-pixel 1, the second sub-pixel 2, and the third sub-pixel 3 are formed through evaporation using the above-mentioned mask.

According to the display substrate manufactured by the above-mentioned method, the luminance brightness ratio of the first sub-pixel 1 is greater than the luminance brightness ratio of the second sub-pixel 2, the luminance brightness ratio of the second sub-pixel 2 is greater than the luminance brightness ratio of the third sub-pixel 3, the first sub-pixel 1 and the second sub-pixel 2 are located in the first column, and the third sub-pixel 3 is located in the second column, so that the brightness center is located between the first sub-pixel 1 and the second sub-pixel 2 in each pixel unit. In addition, the luminance brightness ratio of the first sub-pixel 1 is the greatest, so the brightness center in each pixel unit is closer to the first sub-pixel 1.

In addition, the first sub-pixel 1 and the second sub-pixel 2 in the first pixel unit are arranged in an order opposite to the first sub-pixel 1 and the second sub-pixel 2 in the second pixel unit in the first direction, and the distance between the first sub-pixels 1 is less than the distance between the second sub-pixels 2 in the first pixel unit and the second pixel unit adjacent to each other, so the brightness centers of the pixel units in a same row are arranged on a same horizontal line extending in the second direction. Moreover, the first sub-pixel 1 and the second sub-pixel 2 in each pixel unit in each column are arranged in a same column in the first direction, so the brightness centers of the pixel units in a same column are arranged on a same vertical line extending in the first direction.

Hence, in the display substrate manufactured using the method in the embodiments of the present disclosure, depending on the difference of a human eye visual system in the sensitivities to the colors, the brightness centers of the white points formed by the pixel units are arranged evenly at an equal distance on a line in each of the horizontal direction, the longitudinal direction and a 45° direction. As a result, it is able to achieve an even display effect without any grains or serrations, thereby to solve the problem in the related art where the display effect is adversely affected due to the sharing of the dummy pixels.

In addition, the luminance brightness ratio of each of the first sub-pixel 1 and the second sub-pixel 2 is relatively high, so the first sub-pixel 1 and the second sub-pixel 2 are arranged in the same column, so as to not only prevent the occurrence of the colored edge when the first sub-pixels 1 and the second sub-pixels 2 are arranged in different columns, but also prevent the occurrence of the colored edge when the first sub-pixel 1 is combined with the third sub-pixel 3 or the second sub-pixel 2 is combined with the third sub-pixel 3. The luminance brightness ratio of the third sub-pixel 3 is low, and when the third sub-pixels 3 are arranged in another column, the brightness is even ignored by the human eye and no colored edge occurs, so it is able to improve an overall display effect of the display substrate.

In addition, in the display substrate manufactured using the method according to the embodiments of the present disclosure, in the first direction, the first sub-pixel 1 and the second sub-pixel 2 are arranged in the first column, and the third sub-pixel 3 is arranged in the second column. The first sub-pixels 1 and the second sub-pixels 2 in the pixel units in each column are arranged in a same column in the first direction, and the third sub-pixels 3 in the pixel units in each column are arranged in a same column in the first direction. At this time, the pixel apertures 4 in the mask for forming the sub-pixels are arranged evenly in an array form in each direction, and a portion of a mask body of the mask between the two adjacent columns of pixel apertures 4 extends in the first direction. As a result, it is able to provide the mask with stronger mechanical stability, thereby to reduce the difficulty in the manufacture of the FMM as well as the difficulty in a stretching process.

It should be further appreciated that, the above embodiments have been described in a progressive manner, and the same or similar contents in the embodiments have not been repeated, i.e., each embodiment has merely focused on the difference from the others. Especially, the method embodiments are substantially similar to the product embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

The invention claimed is:

1. A display substrate, comprising a base substrate and a plurality of pixel units arranged in an array form on the base substrate, wherein each pixel unit at least comprises a first sub-pixel, a second sub-pixel and a third sub-pixel, a luminance brightness ratio of the first sub-pixel is greater than a luminance brightness ratio of the second sub-pixel, and the luminance brightness ratio of the second sub-pixel is greater than a luminance brightness ratio of the third sub-pixel; in a first direction, the first sub-pixel and the second sub-pixel are located in a first column, the third sub-pixel is located in a second column, and the first column and the second column are arranged in a second direction crossing the first direction; the plurality of pixel units comprises a plurality of first pixel units and a plurality of second pixel units, and the first sub-pixel and the second sub-pixel in the first pixel unit are arranged in an order opposite to the first sub-pixel and the second sub-pixel in the second pixel unit in the first direction; and the plurality of pixel units is arranged in rows and columns, the first pixel units and the second pixel units in each row are arranged alternately, a distance between the first sub-pixels is less than a distance between the second sub-pixels in the first pixel unit and the second pixel unit adjacent to each other, and the first sub-pixels and the second sub-pixels in the pixel units in each column are arranged in a same column in the first direction;

wherein in the pixel units in each row, at least a part of third sub-pixels in the first pixel units are staggered from at least a part of third sub-pixels in the second pixel units in the first direction.

2. The display substrate according to claim 1, wherein in the pixel units in each row, at least a part of first sub-pixels in the first pixel units are staggered from at least a part of second sub-pixels in the second pixel units in the first direction, and in the pixel units in each row, at least a part of second sub-pixels in the first pixel units are staggered from at least a part of first sub-pixels in the second pixel units in the first direction.

3. The display substrate according to claim 1, wherein the third sub-pixels in the pixel units in each row have a same height in the first direction.

4. The display substrate according to claim 1, wherein in the pixel units in each row, a height of the third sub-pixel in each first pixel unit is the same as a height of the first sub-pixel in each second pixel unit in the first direction.

5. The display substrate according to claim 1, wherein in each of the first pixel units and the second pixel units, a pixel brightness center of a pixel comprising the first sub-pixel, the second sub-pixel and the third sub-pixel is located between the first sub-pixel and the second sub-pixel, and a distance L1 between the pixel brightness center and a center of gravity of the first sub-pixel in the pixel unit to which the first sub-pixel belongs satisfies $L1=(\frac{1}{3}) L$, where L is a distance between the center of gravity of the first sub-pixel and a center of gravity of the second sub-pixel in the same pixel unit, wherein in the pixel units in each row, the pixel brightness center of the first pixel unit and the pixel brightness center of the second pixel unit are located in the same row in the second direction, and the pixel brightness centers in the pixel units are arranged evenly in an array form in the first direction and the second direction.

6. The display substrate according to claim 1, wherein the pixel units in each column comprises a plurality of first pixel units or a plurality of second pixel units.

7. The display substrate according to claim 6, wherein the first sub-pixels and the second sub-pixels are arranged alternately and spaced apart from each other at a same interval in the pixel units in each column.

8. The display substrate according to claim 1, wherein the first pixel units and the second pixel units are arranged alternately in the first direction in the pixel units in each column.

9. The display substrate according to claim 1, wherein the first sub-pixel, the second sub-pixel and the third sub-pixel are each of a rectangular shape, and a long side of the third sub-pixel extends in the first direction.

10. The display substrate according to claim 1, wherein the first sub-pixel comprises a green sub-pixel, the second sub-pixel comprises a red sub-pixel and the third sub-pixel comprises a blue sub-pixel.

11. The display substrate according to claim 1, wherein in each pixel unit, a distance between a center of gravity of the first sub-pixel and a center of gravity of the second sub-pixel, a distance between the center of gravity of the first sub-pixel and a center of gravity of the third sub-pixel, and a distance between the center of gravity of the second sub-pixel and the center of gravity of the third sub-pixel are the same.

12. A display apparatus, comprising the display substrate according to claim 1.

13. A method for manufacturing a display substrate, wherein the display substrate comprises a base substrate and a plurality of pixel units arranged in an array form on the base substrate, the plurality of pixel units is arranged in rows and columns, and each pixel unit at least comprises a first sub-pixel, a second sub-pixel and a third sub-pixel, wherein the method comprises forming at least one of the first sub-pixel, the second sub-pixel and the third sub-pixel through a mask, the mask comprises a mask body and a plurality of pixel apertures formed in the mask body, the plurality of pixel apertures comprises pixel apertures arranged in columns in a second direction, the pixel apertures in each column comprise a plurality of pixel apertures arranged in a first direction crossing the second direction, and a portion of the mask body between two adjacent columns of pixel apertures extends in the first direction; the first sub-pixel and the second sub-pixel are located in a first column, the third sub-pixel is located in a second column, a luminance brightness ratio of the first sub-pixel is greater than a luminance brightness ratio of the second sub-pixel, and the luminance brightness ratio of the second sub-pixel is greater than a luminance brightness ratio of the third sub-pixel; the plurality of pixel units comprises a plurality of first pixel units and a plurality of second pixel units; in the first pixel unit, the first sub-pixel is close to a first end of the third sub-pixel, and the second sub-pixel is close to a second end of the third sub-pixel; in the second pixel unit, the first sub-pixel is close to a second end of the third sub-pixel, and the second sub-pixel is close to a first end of the third sub-pixel; the first pixel units and the second pixel units are arranged alternately in the pixel units in each row, and in the first pixel unit and the second pixel unit adjacent to each other, a distance between the first sub-pixels is less than a distance between the second sub-pixels; and the first sub-pixels and the second sub-pixels in the pixel units in each column are located in a same column;

wherein in the pixel units in each row, at least a part of third sub-pixels in the first pixel units are staggered from at least a part of third sub-pixels in the second pixel units in the first direction.

14. The display apparatus according to claim 12, wherein in the pixel units in each row, at least a part of first sub-pixels in the first pixel units are staggered from at least a part of second sub-pixels in the second pixel units in the first direction, and in the pixel units in each row, at least a part of second sub-pixels in the first pixel units are staggered from at least a part of first sub-pixels in the second pixel units in the first direction.

15. The display apparatus according to claim 12, wherein the third sub-pixels in the pixel units in each row have a same height in the first direction.

\* \* \* \* \*